(12) United States Patent
Kim

(10) Patent No.: US 9,805,639 B2
(45) Date of Patent: Oct. 31, 2017

(54) FLEXIBLE DISPLAY APPARATUS INCLUDING DRIVER

(71) Applicant: Samsung Display Co., LTD., Yongin, Gyeonggi-Do (KR)

(72) Inventor: Sangil Kim, Yongin (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 86 days.

(21) Appl. No.: 14/803,567

(22) Filed: Jul. 20, 2015

(65) Prior Publication Data

US 2016/0111037 A1   Apr. 21, 2016

(30) Foreign Application Priority Data

Oct. 17, 2014  (KR) .......................... 10-2014-0141192

(51) Int. Cl.
*G09G 3/20* (2006.01)
*G02F 1/133* (2006.01)
(Continued)

(52) U.S. Cl.
CPC ....... *G09G 3/2092* (2013.01); *G02F 1/13306* (2013.01); *G02F 1/13452* (2013.01);
(Continued)

(58) Field of Classification Search
CPC ............. G02F 1/13306; G02F 1/13452; G02F 1/1652; G09G 3/092; G09G 3/20;
(Continued)

(56) References Cited

U.S. PATENT DOCUMENTS 6,462,795 B1   10/2002   Clarke
2001/0024561 A1   9/2001   Cornelissen et al.
(Continued)

FOREIGN PATENT DOCUMENTS

JP    2002297066 A    10/2002
JP    2007520723 A    7/2007
(Continued)

OTHER PUBLICATIONS

Extended European Search Report for Application No. 15190291.3-1903 dated Mar. 10, 2016.

*Primary Examiner* — Lisa Landis
(74) *Attorney, Agent, or Firm* — Cantor Colburn LLP

(57) ABSTRACT

A flexible display apparatus includes a flexible display panel including a display region configured to display an image and a non-display region extending outside the display region and having a first driver and a second driver arranged to communicate electrical signals with the display region, and at least one flexible printed circuit boards electrically connected to the flexible display panel, where the first driver is arranged on both opposite sides of a first edge of the flexible display panel in a rolled direction of the flexible display panel, the second driver is arranged on both opposite sides of a second edge of the flexible display panel in a direction intersecting the rolled direction of the flexible display panel, and the at least one flexible printed circuit boards are simultaneously connected to the both opposite sides of the first edge.

19 Claims, 3 Drawing Sheets

(51) Int. Cl.
*G02F 1/1333* (2006.01)
*G02F 1/1345* (2006.01)
*G06F 1/16* (2006.01)
*H01L 27/32* (2006.01)

(52) U.S. Cl.
CPC ...... *G02F 1/133305* (2013.01); *G06F 1/1652* (2013.01); *G09G 3/20* (2013.01); *G09G 3/2003* (2013.01); *G09G 2300/0408* (2013.01); *G09G 2300/0426* (2013.01); *G09G 2330/08* (2013.01); *G09G 2380/02* (2013.01); *H01L 27/3276* (2013.01); *H01L 2251/5338* (2013.01)

(58) Field of Classification Search
CPC ......... G09G 3/2003; G09G 2300/0408; G09G 2300/0426; G09G 2330/08; G09G 2380/02
See application file for complete search history.

(56) References Cited

U.S. PATENT DOCUMENTS

| | | | |
|---|---|---|---|
| 2007/0097708 A1 | 5/2007 | Shim et al. | |
| 2008/0137328 A1 | 6/2008 | Lee et al. | |
| 2010/0277443 A1* | 11/2010 | Yamazaki | G06F 1/1616 345/204 |
| 2011/0122559 A1* | 5/2011 | Lee | B32B 17/061 361/679.01 |
| 2011/0228231 A1 | 9/2011 | Schreiber et al. | |
| 2012/0107978 A1 | 5/2012 | Shin et al. | |
| 2012/0306910 A1 | 12/2012 | Kim et al. | |
| 2013/0299789 A1 | 11/2013 | Yamazaki et al. | |
| 2013/0321251 A1* | 12/2013 | Kang | G09G 3/36 345/87 |
| 2016/0299526 A1* | 10/2016 | Inagaki | G06F 1/163 |

FOREIGN PATENT DOCUMENTS

| | | |
|---|---|---|
| JP | 2010008480 A | 1/2010 |
| KR | 1019950009520 A | 4/1995 |
| KR | 20010075018 A | 8/2001 |
| KR | 20010104725 A | 11/2001 |
| KR | 100468595 B1 | 1/2005 |
| KR | 100469741 B1 | 1/2005 |
| KR | 1020050024468 A | 3/2005 |
| KR | 1020080052502 A | 6/2008 |
| KR | 1020120014319 A | 2/2012 |
| KR | 1020120045682 A | 5/2012 |
| KR | 1020120054560 A | 5/2012 |
| KR | 1020120134228 A | 12/2012 |
| KR | 1020130077054 A | 7/2013 |

* cited by examiner

FLEXIBLE DISPLAY APPARATUS INCLUDING DRIVER

This application claims priority to Korean Patent Application No. 10-2014-0141192, filed on Oct. 17, 2014, in the Korean Intellectual Property Office, and all the benefits accruing therefrom under 35 U.S.C. §119, the disclosure of which is incorporated herein in its entirety by reference.

BACKGROUND

1. Field

One or more exemplary embodiments relate to flexible display apparatuses.

2. Description of the Related Art

In general, display apparatuses may be used in mobile apparatuses such as smart phones, digital cameras, camcorders, portable information terminals, ultra-slim notebook computers, tablet personal computers ("PCs"), or laptop computers, and electronic apparatuses such as ultra-thin televisions ("TVs"), advertising boards, or exhibition displays.

Recently, research has been conducted to manufacture slimmer display apparatuses. Among the slimmer display apparatuses, flexible display apparatuses, which are easy to carry and capable of being applied to apparatuses of various shapes, are esteemed as next-generation display apparatuses.

SUMMARY

In the case of a flexible display apparatus, it is necessary to minimize image quality degradation when the flexible display apparatus is rolled in one direction.

One or more exemplary embodiments include flexible display apparatuses.

Additional exemplary embodiments will be set forth in part in the description which follows and, in part, will be apparent from the description, or may be learned by practice of the presented exemplary embodiments.

According to one or more exemplary embodiments, a flexible display apparatus includes a flexible display panel including a display region implementing an image and a non-display region extending outside the display region and having a first driver and a second driver arranged to communicate electrical signals with the display region, and at least one flexible printed circuit boards ("FPCBs") electrically connected to the flexible display panel, wherein the first driver is arranged on both opposite sides of a first edge of the flexible display panel in a rolled direction of the flexible display panel, the second driver is arranged on both opposite sides of a second edge of the flexible display panel in a direction intersecting the rolled direction of the flexible display panel, and the at least one FPCBs are simultaneously connected to both opposite sides of the first edge.

In an exemplary embodiment, the at least one FPCBs may include a first FPCB and a second FPCB, the first FPCB may be connected to a first portion of the first edge, the second FPCB may be connected to a second portion of the first edge that is opposite to the first portion of the first edge, an external circuit board may be installed between the first FPCB and the second FPCB, and the first FPCB and the second FPCB may be simultaneously connected to the external circuit board.

In an exemplary embodiment, the first FPCB, the external circuit board, and the second FPCB may be located together in a space defined between the first portion and the second portion of the first edge.

In an exemplary embodiment, the at least one FPCBs may be simultaneously connected to a first portion of the first edge and a second portion of the first edge that is opposite to the first portion of the first edge, and an external circuit board may be connected to the at least one FPCBs.

In an exemplary embodiment, the at least one FPCBs may be located in a space defined between the first portion and the second portion of the first edge of the flexible display panel, and the external circuit board may be located outside the second edge.

In an exemplary embodiment, the first driver may include a data driver, the second driver may include a gate driver, the data driver may be arranged on both opposite sides of the first edge, and the gate driver may be arranged on both opposite sides of the second edge.

In an exemplary embodiment, the gate driver may include an amorphous silicon gate ("ASG") circuit.

In an exemplary embodiment, the gate driver may include an oxide semiconductor gate ("OSG") circuit.

In an exemplary embodiment, the gate driver may be disposed at a first portion of the second edge and a second portion of the second edge that is opposite to the first portion of the second edge, and the gate driver may alternately apply electrical signals at the first portion and the second portion of the second edge.

In an exemplary embodiment, the data driver may be disposed at a first portion of the first edge and a second portion of the first edge that is opposite to the first portion of the first edge, and the gate driver may apply a same electrical signal at the first portion and the second portion of the first edge.

In an exemplary embodiment, the flexible display panel may include a glass substrate.

In an exemplary embodiment, the glass substrate may have a thickness of about 0.1 millimeter (mm) or less.

In an exemplary embodiment, the flexible display panel may include a flexible film.

In an exemplary embodiment, the flexible film may include at least one of polyamide ("PA"), polyimide ("PI"), polycarbonate ("PC"), polyethersulphone ("PES"), polyethylene terephthalate ("PET"), polyethylenenaphthalate ("PEN"), polyarylate ("PAR"), and fiberglass reinforced plastic ("FRP").

In an exemplary embodiment, the flexible display panel may be a liquid crystal display ("LCD") panel.

In an exemplary embodiment, the flexible display panel may be an organic light-emitting display ("OLED") panel.

In an exemplary embodiment, the at least one FPCBs may include a flexible film, a first terminal arranged at an edge of the flexible film and connected to a display panel, a second terminal arranged at another edge of the flexible film and connected to an external circuit board, and a driving integrated circuit ("IC") mounted on the flexible film.

In an exemplary embodiment, a plurality of pixels implementing images in different colors may be arranged in the display region, and the plurality of pixels may be longer in the rolled direction of the flexible display panel than in the direction intersecting the rolled direction of the flexible display panel.

In an exemplary embodiment, the flexible display panel may be longer in the rolled direction of the flexible display panel than in other directions.

BRIEF DESCRIPTION OF THE DRAWINGS

These and/or other exemplary embodiments will become apparent and more readily appreciated from the following description of exemplary embodiments, taken in conjunction with the accompanying drawings in which.

DETAILED DESCRIPTION

Figure 1:
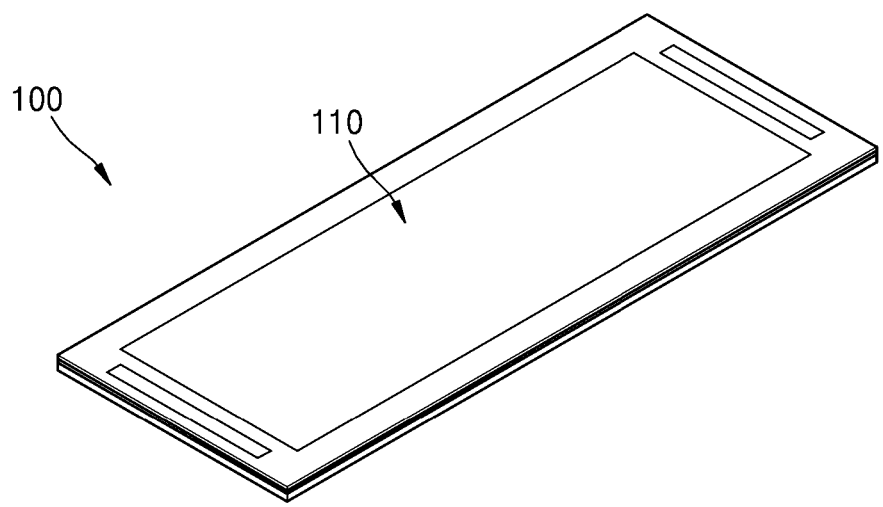
FIG. 1 is a perspective view of an exemplary embodiment of an unfolded state of a flexible display apparatus according to the invention.

Reference will now be made in detail to exemplary embodiments, examples of which are illustrated in the accompanying drawings, wherein like reference numerals refer to like elements throughout. In this regard, the exemplary embodiments may have different forms and should not be construed as being limited to the descriptions set forth herein. Accordingly, the exemplary embodiments are merely described below, by referring to the figures, to explain exemplary embodiments of the description.

The invention may include various embodiments and modifications, and exemplary embodiments thereof are illustrated in the drawings and will be described herein in detail. However, it will be understood that the invention is not limited to the exemplary embodiments and includes all modifications, equivalents and substitutions falling within the spirit and scope of the invention. In the following description, detailed descriptions of well-known functions or configurations will be omitted since they would unnecessarily obscure the subject matters of the invention.

Although terms such as "first" and "second" may be used herein to describe various elements, these elements should not be limited by these terms. These terms are only used to distinguish one element from another element.

The terminology used herein is for the purpose of describing particular embodiments only and is not intended to limit the invention. As used herein, the singular forms "a", "an", and "the" are intended to include the plural forms as well, unless the context clearly indicates otherwise. It will be understood that terms such as "comprise", "include", and "have", when used herein, specify the presence of stated features, integers, steps, operations, elements, components, or combinations thereof, but do not preclude the presence or addition of one or more other features, integers, steps, operations, elements, components, or combinations thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, flexible display apparatuses according to exemplary embodiments will be described in detail with reference to the accompanying drawings. In the following description, like reference numerals denote like elements, and redundant descriptions thereof will be omitted.

Figure 2:
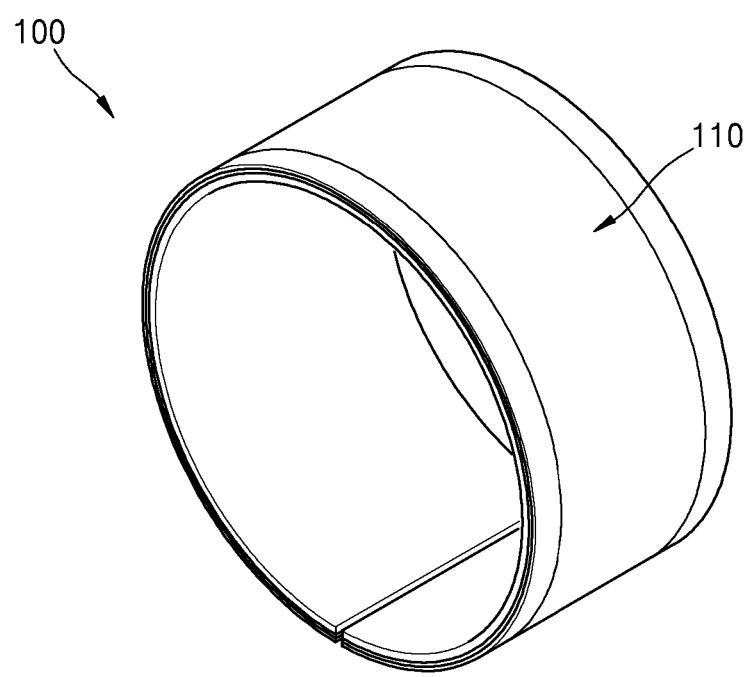
FIG. 2 is a perspective view of a rolled state of the flexible display apparatus of FIG. 1.

FIG. 1 is a perspective view of an unfolded state of a flexible display apparatus 100 according to an exemplary embodiment. FIG. 2 is a perspective view of a rolled state of the flexible display apparatus 100 of FIG. 1.

Referring to FIGS. 1 and 2, the flexible display apparatus 100 includes a flexible display panel 110 that displays an image. In an exemplary embodiment, the flexible display panel 110 includes a thin film for implementing a screen and/or various films such as a touchscreen and a polarizer.

The flexible display apparatus 100 may display an image at various angles by various states such as an unfolded state, a curved state, and a cylindrically rolled state, for example.

In the exemplary embodiment, the flexible display apparatus 100 may include a display apparatus such as a liquid crystal display ("LCD") apparatus, an organic light-emitting display ("OLED") apparatus, a field emission display ("FED") apparatus, or an electronic paper display ("EPD") apparatus.

In an exemplary embodiment, the LCD apparatus includes a first substrate, a second substrate, and a liquid crystal injected between the first substrate and the second substrate.

In the exemplary embodiment, a plurality of gate lines, a data line perpendicular to the gate line, a pixel electrode in each pixel region defined by the intersection of the gate line and the data line, and a thin film transistor ("TFT") switched by a signal of the gate line to transfer a signal of the data line to each pixel electrode, may be disposed on the first substrate.

In an exemplary embodiment, a black matrix for blocking light in regions other than the pixel region, a color filter for displaying colors, and a common electrode for implementing images, may be disposed on the second substrate.

In another exemplary embodiment, the LCD apparatus may include only one substrate in order to reduce the thickness thereof. In the exemplary embodiment, a first electrode, a second electrode insulated from the first electrode and defining a tunnel-shaped cavity extending between the first electrode and the second electrode, a liquid crystal provided in the tunnel-shaped cavity, and a passivation layer covering the second electrode and sealing the tunnel-shaped cavity, may be disposed on one substrate. In the exemplary embodiment, a color filter may be disposed between the second electrode and the passivation layer.

Figure 3:
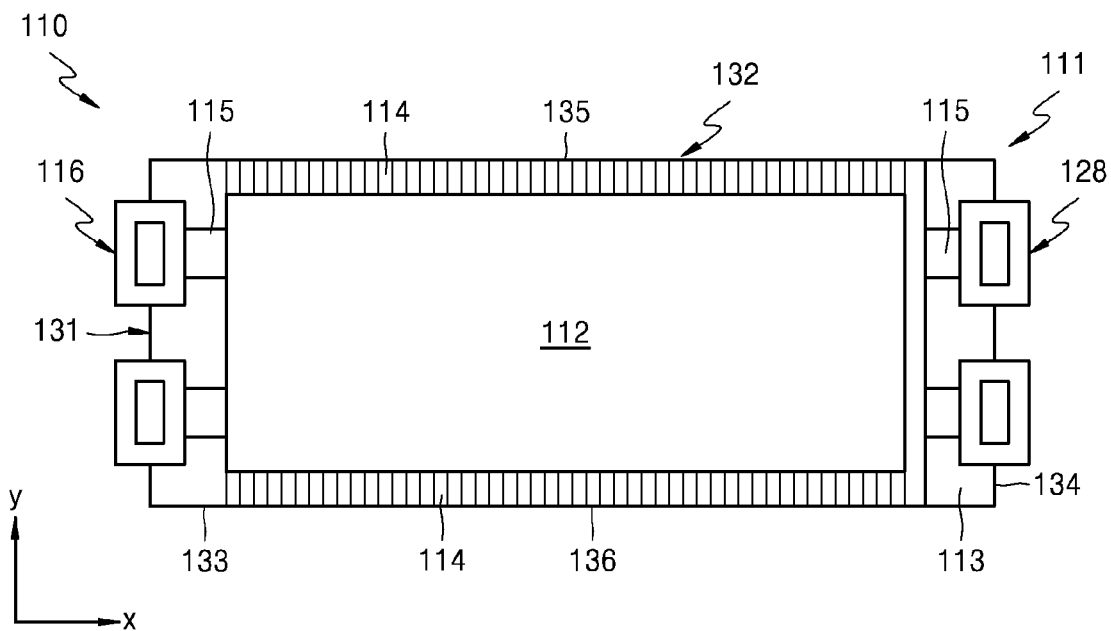
FIG. 3 is a plan view of a flexible display panel of FIG. 1.
Figure 4:
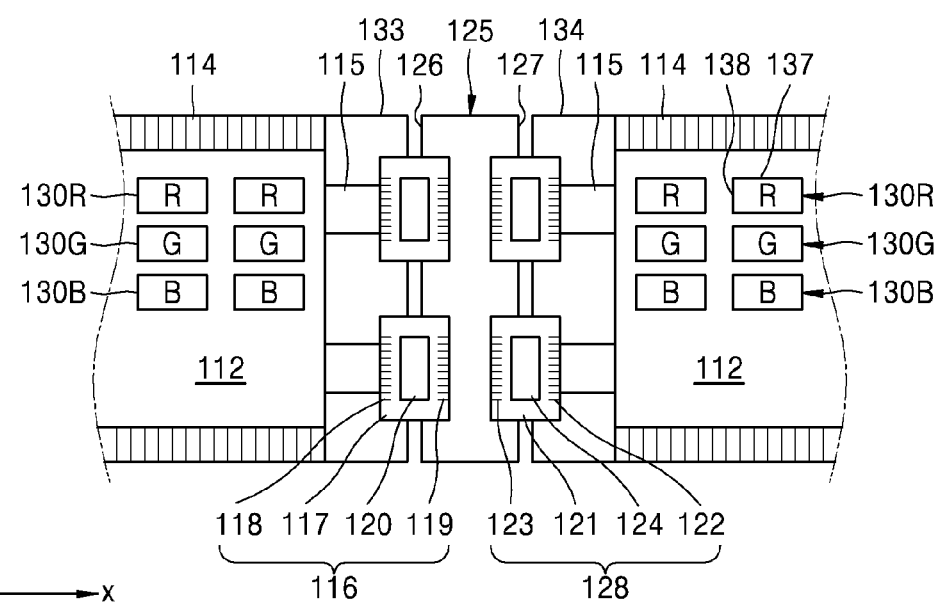
FIG. 4 is an enlarged plan view of edges of the flexible display panel of FIG. 3.

FIG. 3 is a plan view of the flexible display panel 110 of FIG. 1. FIG. 4 is an enlarged plan view of edges of the flexible display panel 110 of FIG. 3.

Referring to FIGS. 3 and 4, the flexible display panel 110 includes a flexible substrate 111.

In an exemplary embodiment, the flexible substrate 111 includes a glass substrate or a flexible film, for example.

When the flexible substrate 111 includes a glass, the flexible substrate 111 has a thickness allowing the flexible substrate 111 to be rolled. In an exemplary embodiment, the glass may have a thickness of about 0.1 millimeter (mm) or less, for example.

When the flexible substrate 111 includes a flexible film, the flexible substrate 111 may include any polymer material including at least one of polyamide ("PA"), polyimide ("PI"), polycarbonate ("PC"), polyethersulphone ("PES"), polyethylene terephthalate ("PET"), polyethylenenaphthalate ("PEN"), polyarylate ("PAR"), and fiberglass reinforced plastic ("FRP"), for example.

The flexible substrate 111 may be transparent, semitransparent, or opaque.

The flexible display panel 110 includes a display region 112 displaying an image and a non-display region 113 extending outside the display region 112.

In the display region 112, at least one TFT and a display device may be patterned to implement an image.

A gate driver 114 communicating electrical signals with the display region 112 and supplying a gate driving signal, and a data driver 115 supplying an image signal may be arranged in the non-display region 113.

The gate driver 114 and the data driver 115 may be connected with the display region 112 in various forms, and may drive pixels 130R, 130G, and 130B of the display region 112 by respectively supplying a scan signal and an image signal to gate lines and data lines that are disposed in the display region 112.

One or more flexible printed circuit boards ("FPCBs") 116 and 128, which are electrically connected to the gate driver 114 and the data driver 115 and communicate electrical signals with an external circuit board 125, may be connected to the non-display region 113.

The data driver 115 may be arranged on both opposite sides of a first edge 131 of the flexible display panel 110 in a rolled direction of the flexible display panel 110, and the gate driver 114 may be arranged on both opposite sides of a second edge 132 of the flexible display panel 110 in a direction intersecting the rolled direction of the flexible display panel 110.

The one or more FPCBs 116 and 128 may be installed on both opposite sides of the first edge 131 of the flexible display panel 110 in the rolled direction of the flexible display panel 110, and may be simultaneously connected to both opposite sides of the first edge 131 of the flexible display panel 110.

In detail, the flexible display panel 110 may include a flexible material. The flexible display panel 110 may be rolled in one direction. In the exemplary embodiment, the flexible display panel 110 may be cylindrically rolled around a Y axis in an x-axis direction. The flexible display panel 110 may be provided to be longer in the rolled direction (x-axis direction) of the flexible display panel 110 than in other directions, for example, the direction (y-axis direction) intersecting the rolled direction of the flexible display panel 110.

A plurality of gate drivers 114 may be arranged on both opposite sides of the second edge 132 of the flexible display panel 110 in the direction (y-axis direction) intersecting the rolled direction (x-axis direction) of the flexible display panel 110.

The gate drivers 114 may be arranged at a first portion 135 of the second edge 132 of the flexible display panel 110 in the direction intersecting the rolled direction of the flexible display panel 110 and a second portion 136 of the second edge 132 that is opposite to the first portion 135 of the second edge 132. That is, the gate drivers 114 may be arranged respectively on a top portion and a bottom portion of the flexible display panel 110 in the y-axis direction.

A plurality of data drivers 115 may be arranged on both opposite sides of the first edge 131 of the flexible display panel 110 in the rolled direction (x-axis direction) of the flexible display panel 110. The data drivers 115 may be arranged at a first portion 133 of the first edge 131 of the flexible display panel 110 in the rolled direction of the flexible display panel 110 and a second portion 134 of the first edge 131 that is opposite to the first portion 133 of the first edge 131. That is, the data drivers 115 may be arranged respectively on a left portion and a right portion of the flexible display panel 110 in the x-axis direction.

In an exemplary embodiment, the gate driver 114 may include an amorphous silicon gate ("ASG") circuit or an oxide semiconductor gate ("OSG") circuit so that the flexible display panel 110 may be easily rolled in one direction. In an exemplary embodiment, the oxide semiconductor may include an oxide of a material including Group 4, 12, 13, or 14 metal elements such as zinc (Zn), indium (In), gallium (Ga), tin (Sn), cadmium (Cd), germanium (Ge), and hafnium (Hf), and any combination thereof.

The gate driver 114 may be electrically connected to a gate electrode in the display region 112. In an exemplary embodiment, the gate driver 114 including an ASG circuit or an OSG circuit may have a thin-film circuit pattern using a TFT.

The data driver 115 may be electrically connected to a source electrode and a drain electrode in the display region 112. In an exemplary embodiment, the data driver 115 may also use an amorphous silicon material or an oxide semiconductor material, for example. In an exemplary embodiment, the data driver 115 may include a silicon integrated circuit ("IC") chip.

The gate driver 114 including an ASG circuit or an OSG circuit, for example, has flexibility. Thus, the rollability of the flexible display apparatus 100 may be greatly improved when the gate driver 114 having flexibility is installed in the first portion 135 and the second portion 136 of the second edge 132 of the flexible display panel 110, compared with a case in which a driver having a rigid silicon IC chip is installed in the same region.

In the exemplary embodiment, since the flexible display panel 110 is rolled cylindrically, the first portion 133 and the second portion 134 of the first edge 131 of the flexible display panel 110 may contact each other.

In this case, a plurality of FPCBs 116 and 128 may be simultaneously connected to both opposite sides of the first edge 131 of the flexible display panel 110 in the rolled direction of the flexible display panel 110.

The FPCBs 116 and 128 may include a first FPCB 116 and a second FPCB 128.

The first FPCB 116 may include a flexible film 117. A plurality of first terminals 118 electrically connected to the flexible display panel 110 may be arranged on an edge of the flexible film 117. A plurality of second terminals 119 electrically connected to the external circuit board 125 may be arranged on another edge of the flexible film 117. A driving IC 120 may be mounted on the flexible film 117.

The first FPCB 116 may be connected to the first portion 133 of the first edge 131 of the flexible display panel 110 in the rolled direction of the flexible display panel 110. A plurality of first FPCBs 116 may be connected to the first portion 133 of the first edge 131 of the flexible display panel 110 along the widthwise direction (y-axis direction) of the flexible display panel 110.

The second FPCB 128 may include a flexible film 121. A plurality of first terminals 122 electrically connected to the flexible display panel 110 may be arranged on an edge of the flexible film 121. A plurality of second terminals 123 electrically connected to the external circuit board 125 may be arranged on another edge of the flexible film 121. A driving IC 124 may be mounted on the flexible film 121.

The second FPCB 128 may be connected to the second portion 134 of the first edge 131 of the flexible display panel 110 in the rolled direction of the flexible display panel 110. A plurality of second FPCBs 128 may be connected to the second portion 134 of the first edge 131 of the flexible display panel 110 along the widthwise direction (y-axis direction) of the flexible display panel 110.

The external circuit board 125 may be disposed between the first FPCB 116 and the second FPCB 128. The second terminals 119 of the first FPCB 116 may be connected to a side 126 of the external circuit board 125, and the second terminals 123 of the second FPCB 128 may be connected to another side 127 of the external circuit board 125. In an exemplary embodiment, the external circuit board 125 may include a flexible film, for example.

In this way, the first FPCB 116 and the second FPCB 128 may be simultaneously connected to the external circuit board 125. Accordingly, an electrical signal may be simultaneously applied from the external circuit board 125 to the first FPCB 116 and the second FPCB 128.

In addition, the first FPCB 116, the external circuit board 125, and the second FPCB 128 may be located together in a space between the first portion 133 and the second portion 134 of the first edge 131 of the flexible display panel 110 that is defined by winding the flexible display panel 110 cylindrically.

In this way, when the flexible display panel 110 is cylindrically rolled to implement an image through the display region 112, the flexibility of the flexible display panel 110 may be improved by the top and bottom disposition of the gate driver 114 having flexibility, and the image quality degradation of the flexible display panel 110 may be reduced by the use of one external circuit board 125.

Since the gate drivers 114 are disposed respectively on the top portion and the bottom portion of the flexible display panel 110, electrical signals may be alternately supplied from the top portion and the bottom portion of the flexible display panel 110 to the display region 112. In detail, electrical signals may be applied in odd order through the gate driver 114 disposed in the first portion 135 of the flexible display panel 110, and electrical signals may be applied in even order through the gate driver 114 disposed in the second portion 136 of the flexible display panel 110.

Data drivers 115 may be installed on both opposite sides of the first edge 131 of the flexible display panel 110 in the rolled direction (x-axis direction) of the flexible display panel 110. Since the data drivers 115 are disposed respectively on the left and right sides of the flexible display panel 110, electrical signals may be simultaneously supplied to the display region 112.

A data line connection failure, which may occur due to the increased length of the flexible display panel 110, may be prevented. In detail, in order to apply a stable data signal, the same signal may be applied from the data driver 115 arranged in the first portion 133 of the first edge 131 of the flexible display panel 110 and the data driver 115 arranged in the second portion 134 of the first edge 131 of the flexible display panel 110 that is opposite to the first portion 133 of the first edge 131 of the flexible display panel 110.

In an exemplary embodiment, the red pixel 130R, the green pixel 130G, and the blue pixel 130B disposed in the display region 112 may have a rectangular shape. In the exemplary embodiment, the red pixel 130R, the green pixel 130G, and the blue pixel 130B may be vertically aligned, and pixels representing same colors may be horizontally aligned. However, the invention is not limited thereto, and the pixels may have various other arrangements.

In detail, according as the gate drivers 114 are installed on the top and bottom sides of the flexible display panel 110 and the data drivers 115 are installed on the left and right sides of the flexible display panel 110, a first length 137 of the red pixel 130R, the green pixel 130G, and the blue pixel 130B in the rolled direction (x-axis direction) of the flexible display panel 110 may be larger than a second length 138 of the red pixel 130R, the green pixel 130G, and the blue pixel 130B in the direction (y-axis direction) intersecting the rolled direction of the flexible display panel 110.

Figure 5:
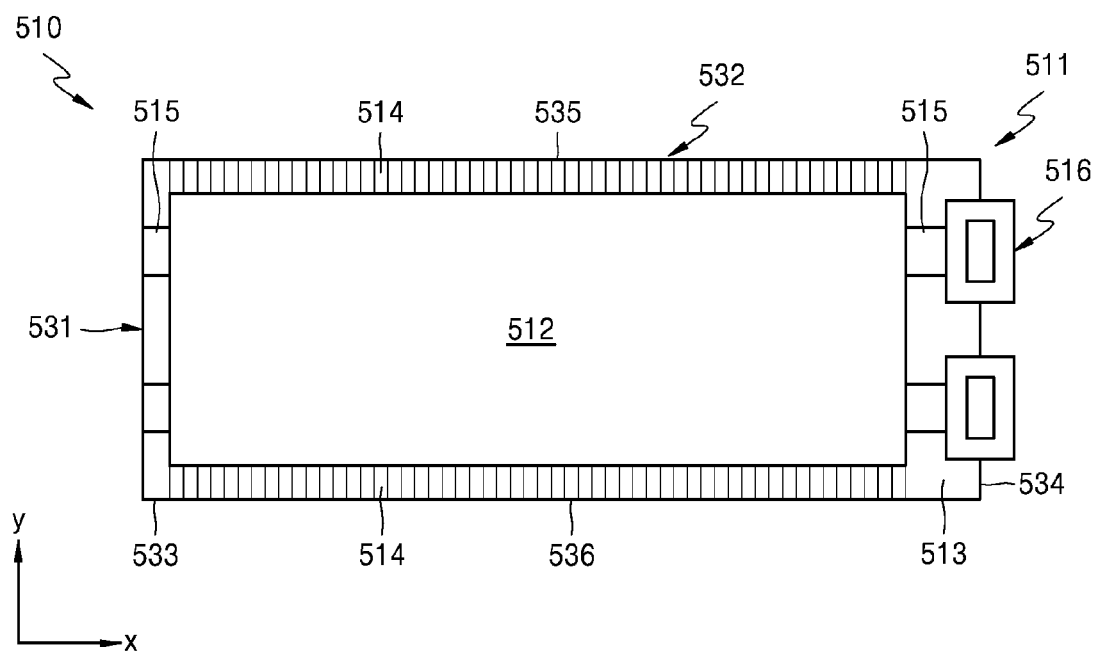
FIG. 5 is a plan view of another exemplary embodiment of a flexible display panel according to the invention.
Figure 6:
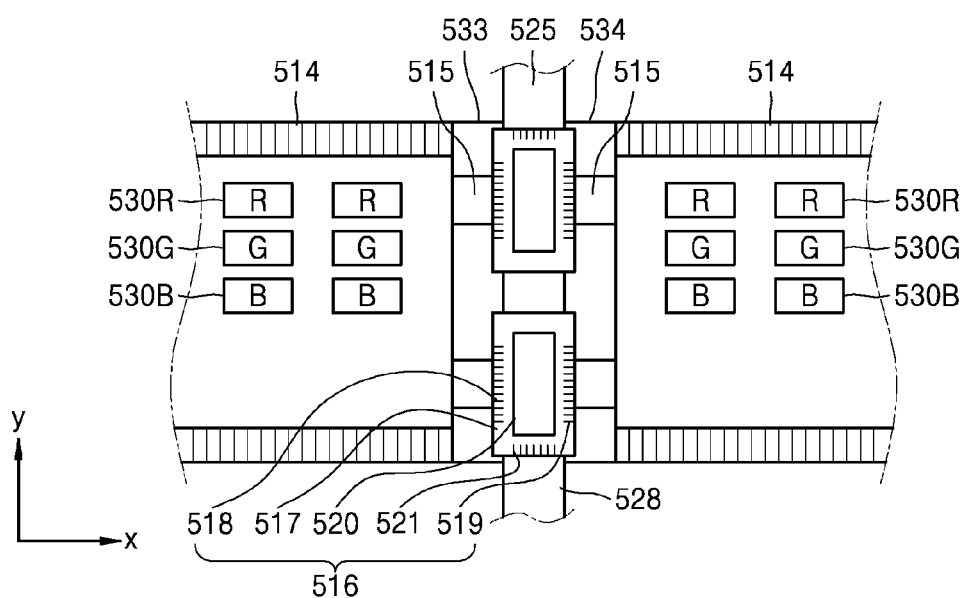
FIG. 6 is an enlarged plan view of edges of the flexible display panel of FIG. 5.

FIG. 5 is a plan view of a flexible display panel 510 according to another exemplary embodiment. FIG. 6 is an enlarged plan view of edges of the flexible display panel 510 of FIG. 5.

Hereinafter, the features of the flexible display panel 510 according to the exemplary embodiment will be described.

Referring to FIGS. 5 and 6, the flexible display panel 510 includes a flexible substrate 511. In an exemplary embodiment, the flexible substrate 511 includes a glass substrate or a flexible film, for example.

The flexible display panel 510 includes a display region 512 implementing an image and a non-display region 513 extending outside the display region 512. A gate driver 514 communicating electrical signals with the display region 512 and supplying a gate driving signal, and a data driver 515 supplying an image signal may be arranged in the non-display region 513.

The gate driver 514 and the data driver 515 may be connected with the display region 512 in various forms and may drive pixels 530R, 530G, and 530B of the display region 512 by respectively supplying a scan signal and an image signal to gate lines and data lines that are disposed in the display region 512.

One or more FPCBs 516, which are electrically connected to the gate driver 514 and the data driver 515 and apply power from one or more external circuit boards 525 and 528, may be connected to the non-display region 513.

The data driver 515 may be arranged on both opposite sides of a first edge 531 of the flexible display panel 510 in a rolled direction (x-axis direction) of the flexible display panel 510, and the gate driver 514 may be arranged on both opposite sides of a second edge 532 of the flexible display panel 510 in a direction (y-axis direction) intersecting the rolled direction of the flexible display panel 510.

The one or more FPCBs 516 may be installed on both opposite sides of the first edge 531 of the flexible display panel 510 in the rolled direction of the flexible display panel 510, and may be simultaneously connected to both opposite sides of the first edge 531 of the flexible display panel 510.

In detail, the flexible display panel 510 may have a cylindrical shape. A plurality of gate drivers 514 may be arranged on both opposite sides of the second edge 532 of the flexible display panel 510 in the direction (y-axis direction) intersecting the rolled direction (x-axis direction) of the flexible display panel 510. The gate drivers 514 may be arranged respectively in a first portion 535 and a second portion 536 of the second edge 532 of the flexible display panel 510 that correspond to a top portion and a bottom portion of the flexible display panel 510 in the y-axis direction.

A plurality of data drivers 515 may be arranged on both opposite sides of the first edge 531 of the flexible display panel 510 in the rolled direction (x-axis direction) of the flexible display panel 510. The data drivers 515 may be arranged respectively in a first portion 533 and a second portion 534 of the first edge 531 of the flexible display panel 510 that correspond to a left portion and a right portion of the flexible display panel 510 in the x-axis direction.

In order to have flexibility, the gate driver 514 may include an OSG circuit or an ASG circuit using a TFT circuit. Accordingly, the rollability of the flexible display panel 510 may be improved.

The FPCBs 516 may be simultaneously connected to both opposite sides of the first edge 531 of the flexible display panel 510 in the rolled direction of the flexible display panel 510.

The FPCB 516 may include a flexible film 517. A plurality of first terminals 518 electrically connected to the flexible display panel 510 may be arranged on an edge of the flexible film 517. A plurality of second terminals 519 electrically connected to the external circuit boards 525 and 528 may be arranged on another edge of the flexible film 517. In an exemplary embodiment, a driving IC 520 may be mounted on the flexible film 517.

By the first terminals 518 and the second terminals 519, the FPCBs 516 may be simultaneously connected to the first portion 533 and the second portion 534 of the first edge 531 of the flexible display panel 510 in the rolled direction of the flexible display panel 510. Also, a plurality of FPCBs 516 may be connected to the first edge 531 of the flexible display panel 510 along the widthwise direction (y-axis direction) of the flexible display panel 510.

The external circuit boards 525 and 528 may include a first external circuit board 525 and a second external circuit board 528. In an exemplary embodiment, the external circuit boards 525 and 528 may have flexibility.

In an exemplary embodiment, the external circuit boards 525 and 528 are not disposed between the first portion 533 and the second portion 534 of the first edge 531 of the flexible display panel 510 in the rolled direction of the flexible display panel 510 but may be disposed outside the second edge 532 of the flexible display panel 510. Only the FPCBs 516 may be disposed between the first portion 533 and the second portion 534 of the first edge 531 of the flexible display panel 510 in the rolled direction of the flexible display panel 510. In an exemplary embodiment, the first and second external circuit boards 525 and 528 may be connected to the FPCBs 516 by third terminals 521.

The first external circuit board 525 may be disposed outside the top edge of the flexible display panel 510 and electrically connected to the FPCB 516, and the second external circuit board 528 may be disposed outside the bottom edge of the flexible display panel 510 and electrically connected to the FPCB 516.

Since the external circuit boards 525 and 528 are located outside the rolled portion of the flexible display panel 510, the non-display region of the flexible display panel 510 may be minimized.

In an exemplary embodiment, the plurality of FPCBs 516 may be electrically connected to each other, and only one external circuit board may be located outside the rolled portion of the flexible display panel 510.

In the exemplary embodiment, the flexible display panel 510 may have any structure in which circuit units are connected on both opposite edges of the flexible display panel 510 in the rolled direction.

The flexible display apparatus may be applied to any display apparatus having flexibility and may further include functional layers such as a touchscreen, a polarizer, and a window cover.

As described above, according to the one or more of the above exemplary embodiments, in the flexible display apparatus, the FPCBs may be simultaneously connected to both opposite sides in the winding direction of the flexible display panel to apply electrical signals thereto.

It should be understood that the exemplary embodiments described herein should be considered in a descriptive sense only and not for purposes of limitation. Descriptions of features or exemplary embodiments within each exemplary embodiment should typically be considered as available for other similar features or exemplary embodiments in other exemplary embodiments.

While one or more exemplary embodiments have been described with reference to the figures, it will be understood by those of ordinary skill in the art that various changes in form and details may be made therein without departing from the spirit and scope of the invention as defined by the following claims.

What is claimed is:

1. A flexible display apparatus comprising:
    a single unitary flexible display panel including a display region configured to display an image and a non-display region extending outside the display region and having a first driver and a second driver configured to communicate electrical signals with the display region; and
    at least one flexible printed circuit boards electrically connected to the single unitary flexible display panel, wherein
    the first driver is arranged on both opposite sides of the single unitary flexible display panel in a rolled direction of the single unitary flexible display panel, the both opposite sides in the rolled direction defining a first edge,
    the second driver is arranged on both opposite sides of the single unitary flexible display panel in a direction intersecting the rolled direction of the single unitary flexible display panel, the both opposite sides in the direction defining a second edge, and the at least one flexible printed circuit boards are simultaneously connected to the both opposite sides of the first edge.

2. The flexible display apparatus of claim 1, wherein
the at least one flexible printed circuit boards include a first flexible printed circuit board and a second flexible printed circuit board,
the first flexible printed circuit board is connected to a first portion of the first edge,
the second flexible printed circuit board is connected to a second portion of the first edge which is opposite to the first portion of the first edge,
an external circuit board is installed between the first flexible printed circuit board and the second flexible printed circuit board, and
the first flexible printed circuit board and the second flexible printed circuit board are simultaneously connected to the external circuit board.

3. The flexible display apparatus of claim 2, wherein the first flexible printed circuit board, the external circuit board, and the second flexible printed circuit board are located together in a space defined between the first portion and the second portion of the first edge of the single unitary flexible display panel.

4. The flexible display apparatus of claim 1, wherein
the at least one flexible printed circuit boards are simultaneously connected to a first portion of the first edge and a second portion of the first edge which is opposite to the first portion of the first edge, and
an external circuit board is connected to the at least one flexible printed circuit boards.

5. The flexible display apparatus of claim 4, wherein
the at least one flexible printed circuit boards are located in a space defined between the first portion and the second portion of the first edge of the single unitary flexible display panel, and
the external circuit board is located outside the second edge.

6. The flexible display apparatus of claim 1, wherein
the first driver includes a data driver,
the second driver includes a gate driver,
the data driver is arranged on the both opposite sides of the first edge, and
the gate driver is arranged on the both opposite sides of the second edge.

7. The flexible display apparatus of claim 6, wherein the gate driver includes an amorphous silicon gate circuit.

8. The flexible display apparatus of claim 6, wherein the gate driver includes an oxide semiconductor gate circuit.

9. The flexible display apparatus of claim 6, wherein
the gate driver is disposed at a first portion of the second edge and a second portion of the second edge which is opposite to the first portion of the second edge, and
the gate driver alternately applies electrical signals at the first portion and the second portion of the second edge.

10. The flexible display apparatus of claim 6, wherein
the data driver is disposed at a first portion of the first edge and a second portion of the first edge which is opposite to the first portion of the first edge, and
the data driver applies a same electrical signal at the first portion and the second portion of the first edge.

11. The flexible display apparatus of claim 1, wherein the single unitary flexible display panel includes a glass substrate.

12. The flexible display apparatus of claim 11, wherein the glass substrate has a thickness of about 0.1 millimeter or less.

13. The flexible display apparatus of claim 1, wherein the single unitary flexible display panel includes a flexible film.

14. The flexible display apparatus of claim 13, wherein the flexible film includes at least one of polyamide, polyimide, polycarbonate, polyethersulphone, polyethylene terephthalate, polyethylenenaphthalate, polyarylate, and fiberglass reinforced plastic.

15. The flexible display apparatus of claim 1, wherein the single unitary flexible display panel includes a liquid crystal display panel.

16. The flexible display apparatus of claim 1, wherein the single unitary flexible display panel includes an organic light-emitting display panel.

17. The flexible display apparatus of claim 1, wherein the at least one flexible printed circuit boards include:
a flexible film;
a first terminal arranged at an edge of the flexible film and connected to a display panel;
a second terminal arranged at another edge of the flexible film and connected to an external circuit board; and
a driving integrated circuit mounted on the flexible film.

18. The flexible display apparatus of claim 1, wherein
a plurality of pixels implementing images in different colors is arranged in the display region, and
the plurality of pixels has a length in the rolled direction of the single unitary flexible display panel larger than a width in the direction intersecting the rolled direction of the single unitary flexible display panel.

19. The flexible display apparatus of claim 1, wherein the single unitary flexible display panel has a length in the rolled direction of the single unitary flexible display panel larger than a width in a direction substantially perpendicular to the rolled direction.

* * * * *